United States Patent [19]

Eaton, Jr.

[11] Patent Number: 4,571,505

[45] Date of Patent: Feb. 18, 1986

[54] METHOD AND APPARATUS OF REDUCING LATCH-UP SUSCEPTIBILITY IN CMOS INTEGRATED CIRCUITS

[75] Inventor: Sargent S. Eaton, Jr., Colorado Springs, Colo.

[73] Assignee: Inmos Corporation, Colorado Springs, Colo.

[21] Appl. No.: 552,249

[22] Filed: Nov. 16, 1983

[51] Int. Cl.[4] .......................................... H03K 17/693
[52] U.S. Cl. ................................ 307/297; 307/296 R; 307/579
[58] Field of Search ............... 307/443, 451, 576, 579, 307/585, 296 R, 297, 304; 357/42

[56] References Cited

U.S. PATENT DOCUMENTS

| | | | |
|---|---|---|---|
| 4,039,869 | 8/1977 | Goldman et al. | 307/304 |
| 4,103,187 | 7/1978 | Imamura | 307/296 R X |
| 4,168,442 | 9/1979 | Satou et al. | 307/451 X |
| 4,223,672 | 11/1980 | Suzuki et al. | 357/42 X |
| 4,353,105 | 10/1982 | Black | 361/101 |
| 4,454,571 | 6/1984 | Miyashita | 307/200 B |
| 4,471,237 | 9/1984 | Kaplan | 307/443 |
| 4,473,758 | 9/1984 | Huntington | 307/451 X |
| 4,477,736 | 10/1984 | Onishi | 307/443 X |
| 4,499,387 | 2/1985 | Konishi | 307/451 X |

FOREIGN PATENT DOCUMENTS

| | | |
|---|---|---|
| 58-2061 | 1/1983 | Japan. |
| 58-52869 | 3/1983 | Japan. |
| 58-82560 | 5/1983 | Japan. |

Primary Examiner—Stanley D. Miller
Assistant Examiner—D. R. Hudspeth
Attorney, Agent, or Firm—Edward D. Manzo; Roger R. Wise

[57] ABSTRACT

Method and apparatus for controlling latch-up in a CMOS circuit senses a power supply transition, clamps the substrate to ground in response to sensing a power supply transition, and releases the clamp after the power supply transition. A charge pump pumps the substrate illustratively to −3 volts. The charge pump, clamping transistor and related elements are on the same CMOS substrate where latch-up is to be controlled. The substrate to ground capacitance of the substrate is increased to prevent localized substrate voltage disturbances which may induce latch-up.

20 Claims, 6 Drawing Figures

METHOD AND APPARATUS OF REDUCING LATCH-UP SUSCEPTIBILITY IN CMOS INTEGRATED CIRCUITS

BACKGROUND OF THE INVENTION

The present invention relates to overcoming the problem of latch-up in CMOS circuitry.

This problem can be understood most easily with reference to FIG. 1 which is a representative cross-sectional view of a portion of a standard N-well CMOS transistor arrangement. As illustrated, FIG. 1 includes a P-type substrate 10 having an N-well 12. Within the N-well 12 are a P+ moat 14, a gate 16, and another P+ moat 18. Elements 14, 16 and 18 form an MOS device. Moat 14 is connected to a voltage source Vcc. Also within well 12 is an N+ moat 20 connected also to Vcc.

Outside of moat 12, there is an N+ moat 22, a gate 24 and another N+ moat 26. Elements 22, 24 and 26 form another MOS transistor. A P+ moat 28 is also included, and moats 26 and 28 are grounded by connection to Vss.

Certain parasitic structures are illustrated in FIG. 1. An NPN transistor 30 is shown at the left side in the P substrate, and a PNP transistor 32 is shown at the right in the N-well. The collector of transistor 30 is the N-well 12, its base is the P substrate and its emitter is N+ moat 26. With regard to transistor 32, the collector is the P type substrate 10, the base is the N-well 12, and the emitter is the P+ type moat 14.

There are resistances between the bases of transistors 30 and 32 between the substrate or well contacts. With respect to transistor 30, a substrate resistance 34 exists between the base of transistor 30 and moat 28. A node 36 is located at the base of transistor 30. With respect to transistor 32, a resistance 38 exists between the base and the N+ moat 20. A node 40 is located schematically between resistance 38 and the base of transistor 32. It will be seen that mode 36 is connected electrically to the base of transistor 30 and to the collector of transistor 32. Similarly node 40 is connected electrically to the base of transistor 32 and to the collector of transistor 30.

The problem of latch-up can now be illustrated. If transistor 32 is turned on, a current passes through node 36, causing the voltage at node 36 to rise. This turns on transistor 30. This in turn causes a current at node 40, which pulls down node 40 in voltage. This turns on transistor 32 even harder. This causes the current to increase, causing the voltage at node 36 to rise even more. This in turn causes transistor 30 to turn on even harder, which has the effect of increasing the current through node 40. It will be seen that this is an ever increasing routine. This circumstance can be triggered by a base current in either transistor 30 or transistor 32. It can be induced by a wide variety of things, including rapid changes in a power supply voltage, light, radiation, input and output over voltage, and on-chip capacitive disturbances. When this occurs, it is referred to by the art as "latch-up."

It is therefore the principal object of the present invention to devise a method and apparatus which overcomes the problem of latch-up in CMOS circuits.

SUMMARY OF THE INVENTION

The foregoing and other objects of the present invention are achieved by a method and apparatus which, according to one of its aspects, does not allow both parasitic transistors to turn on at the same time. According to another aspect of the present invention, one of the nodes is biased with a negative potential, thereby preventing the transistor whose base is connected to the node from turning on.

Another aspect of the present invention is to use the combination of a substrate clamp together with a substrate pump so that the substrate clamp holds the substrate to ground on power-up and prevents latch-up by holding the NPN transistor, illustratively, off, and after power-up, the on-chip substrate bias generator creates a negative voltage sufficient to prevent latch-up during normal operation of the part.

A further aspect of the invention is that the substrate capacitance to ground is high compared to any capacitance coupling to the substrate from other sources.

In the preferred embodiment, the substrate clamp operates by sensing a power supply transition and using a large transistor to hold the substrate to ground while Vcc is changing.

According to still another feature of the invention, to distinguish between a power-up condition and normal Vcc disturbances after power-up, circuitry is included to turn off the transistion sense circuitry once Vbb has pumped down to an acceptably low level.

According to these aspects of the invention, a CMOS circuit can be made latch-up free during normal operation while being sensitive to latch-up during only the more controlled situation of initial power-up.

BRIEF DESCRIPTION OF THE DRAWINGS

In describing the present invention, reference is made to various accompanying figures wherein.

DETAILED DESCRIPTION OF A PREFERRED EMBODIMENT

Figure 1:
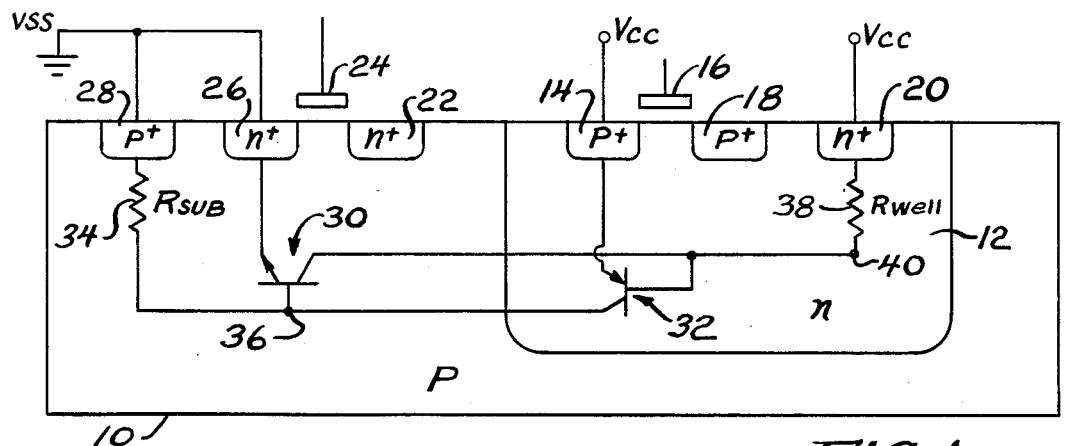
FIG. 1 is a representative crosssectional view of part of a CMOS process, including a representative schematic diagram of parasitic devices inherent in the CMOS part.
Figure 2:
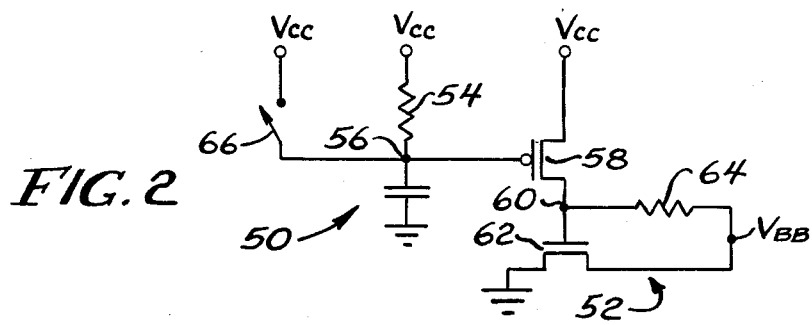
FIG. 2 is a schematic diagram of a simplified illustrative version of a circuit according to the present invention.

Referring now to FIG. 2, a simplified version of a circuit according to the present invention is schematically shown therein. In FIG. 2, according to convention which is also used in FIGS. 1 and 3, each unconnected small circle represents a connection to Vcc. FIG. 2 represents a circuit 50 which includes a clamp portion 52. Circuit 50 is formed on the substrate 10 of FIG. 1, as shown in FIG. 4. During a power-up condition, due to a resistance 54, a node 56 lags behind Vcc. In the preferred embodiment, as will be seen in FIG. 3, resistance 54 is a high impedance transistor. Because of this lag, a transistor 58, which is a P channel device, is turned on. As a result, transistor 58 couples Vcc to a node 60 which is coupled electrically to the gate of a transistor 62 to turn it on. The source/drain path of transistor 62 couples the substrate Vbb to ground. Thus, during power-up conditions, the substrate 10 (FIG. 1) is clamped to ground and therefore latch-up does not occur.

After Vcc becomes stable, node 56 catches up to Vcc; this turns transistor 58 off. A resistance 64 (which is in the preferred embodiment a high impedance N channel FET) is connected between the substrate Vbb and node 60. Consequently, the voltage at node 60 will eventually reach the threshold of transistor 62, thereby turning it off. This releases the clamp which had been holding Vbb to ground.

A charge pump (not shown) pumps the substrate to a negative voltage such as −3 volts. A charge pump suitable for this purpose is disclosed in U.S. Pat. Nos. 4,336,466 (Sud and Hardee, "Substrate Bias Generator") or 4,403,158 (Slemmer, "Two Way Regulated Substrate Bias Generator"), both owned by Inmos Corporation.

Also shown in FIG. 2 is a representative switch 66 connecting node 56 to Vcc. Switch 66 is controlled by Vbb and closes when Vbb equals, illustratively, −3 volts. This is included because transistor 58 should be maintained in an off condition during normal Vcc transitions after power up in order to prevent Vbb from rising to ground.

Figure 3:
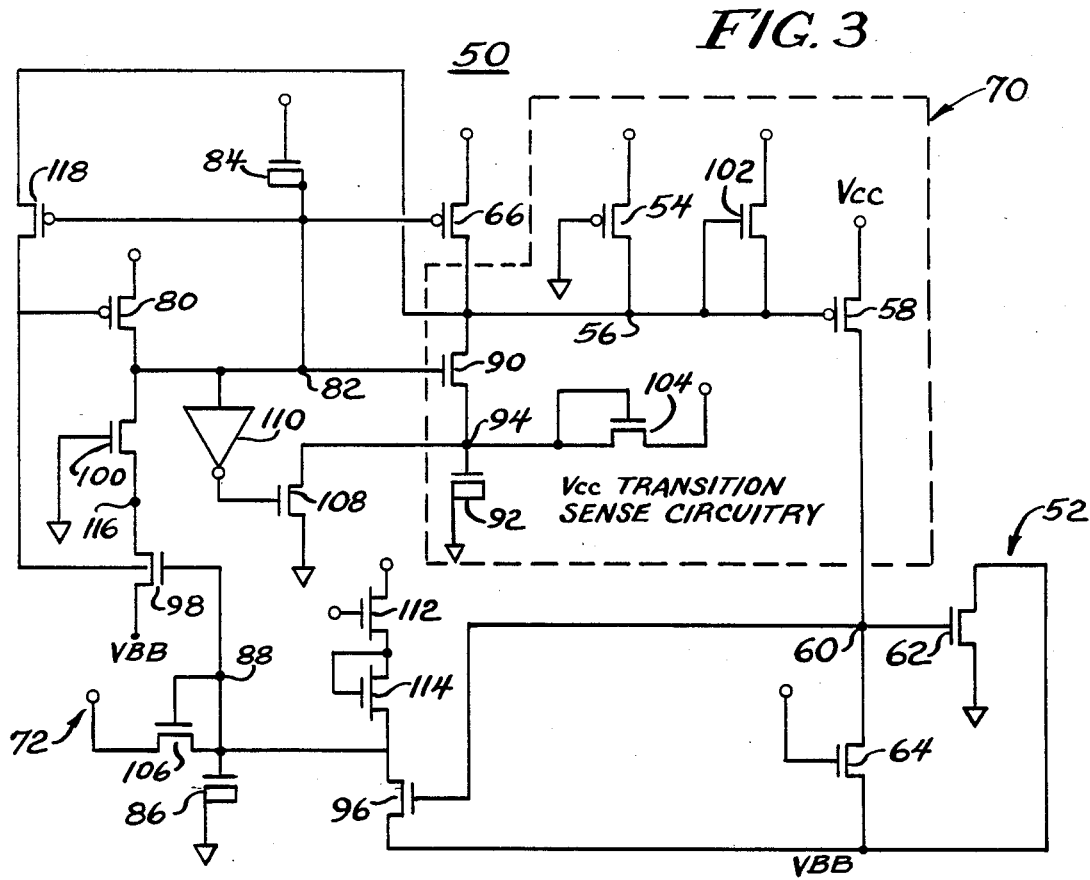
FIG. 3 is a schematic diagram of a circuit according to various features of the present invention.
Figure 4:
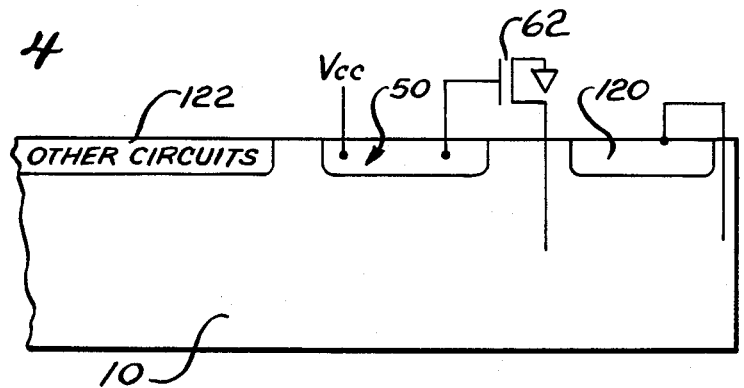
FIG. 4 is a representative sketch showing the relationship of the substrate clamp to the substrate, other on-chip circuits, and a charge pump.

FIG. 3 is a schematic diagram of a preferred embodiment of the present invention. This circuit diagram uses the same reference numerals as FIG. 2. As can be seen, circuit 50 includes the substrate clamp circuit 52, Vcc transition sense circuitry 70 (in a dashed line) and stable power sense circuitry 72 which generally refers to circuitry which is shown to the left of transistor 64 and is outside box 70. The general operation of this circuitry has already been explained with reference to FIG. 2.

Referring now to the further elements of FIG. 3, a P channel transistor 80 has its drain coupled to a node 82 and its source coupled to Vcc. Node 82 is coupled to one side of a capacitor 84 as well as being coupled to the gate of P channel transistor 66. The gate of transistor 80 is coupled to one side of another capacitor 86 whose other side is coupled to ground. A node 88 is located schematically between the nonground side of capacitor 86 and the gate of transistor 80. Node 82 is coupled to the gate of an N channel transistor 90 whose source-drain path selectively couples node 56 to one side of a large capacitor 92 whose other side is grounded. A further node 94 is located between the drain of transistor 90 and the nongrounded side of transistor 92.

The operation of these elements is as follows. On power-up, node 82 follows Vcc upward in voltage because it is pulled up by transistor 80 and capacitor 84. This function of transistor 80 occurs because its gate is coupled to node 88 which is held at ground to capacitor 86. This permits transistor 80 to turn on which couples Vcc to node 82.

When node 82 rises in voltage, it turns on transistor 90 whose source/drain path then couples node 94 to node 56. Capacitor 92 which couples node 94 to ground has a large capacitance on the order of approximately 50 picofarads which contributes the delay at node 56 in respect of transistor 54.

As mentioned, transistor 58 should stay off after Vcc is powered up or else substrate voltage Vbb will rise to ground causing certain circuits to stop working. To insure against this, transistor 66 is used. Node 82 goes negative when Vbb reaches a sufficiently negative voltage. This turns on P channel transistor 66 which prevents transistor 58 from conducting.

When Vcc is stable, clamping transistor 62 is off. Also a transistor 96 is off, thereby allowing node 88 to go high which, because it is coupled to the gate of a transistor 98, causes transistor 98 to turn on. The source-drain path of transistor 98 couples Vbb to another transistor 100, which turns on after Vbb becomes negative. This, in turn, causes node 82 to drop low from its high condition, which turns on P channel transistor 66. Thus, when the substrate voltage Vbb reaches a sufficiently negative voltage, transistor 66 turns on to prevent further clamping of the substrate to ground.

In the event that Vcc drops to ground after having been stable long enough for circuit 50 to stabilize, circuit 50 includes provisions to reset itself, rather than "remembering" that Vcc is stable. Without such provision, the clamping of the substrate to ground may not occur, and latch-up could ensue.

Thus, when Vcc goes to ground, a transistor 102 (within Vcc transition sense circuitry 70) has its gate coupled to its source and will cause node 56 to drop to ground. Similarly, an N-channel transistor 104 is coupled in like fashion to node 94. In the power up sense circuitry 72, a transistor 106, similarly configured, operates similarly with respect to node 88.

Further, to prepare for additional clamping in the event that Vcc should later drop to ground, during the stable power-up, the large capacitor 92 discharges to ground via the source-drain path of a transistor 108. An inverter 110 controls the gate of transistor 108 for this purpose. Thus, instead of waiting for capacitor 92 to discharge upon resetting, capacitor 92 is prepared for a further use.

When a stable power-up is sensed, the gate of transistor 96 and its source become equal in potential via transistor 64. When this happens, transistors 112 and 114 pull up node 88. When Vbb drops in potential due to the charge pump, a node 116 also drops. Node 82 drops because of the source-drain path of transistor 100. As discussed, after node 82 goes low, transistor 58 is shut off.

When node 82 goes to ground, a transistor 118 pulls node 88 all the way to Vcc. The reason for this is that transistor 80 should be off. This can occur only if node 88 is at Vcc. Because transistors 112 and 114 are n-channel devices, there are voltage drops associated with them which lower the voltage at node 88. Thus, the source-drain path of transistor 118 couples Vcc to node 88 (from the source-drain path of transistor 66).

FIG. 4 schematically illustrates the relationship of the substrate clamp 50 on substrate 10. Clamping transistor 62 is illustrated. Reference was made previously in this specification to a charge pump circuit which is designated as 120 in FIG. 4. Thus, it can be seen that the circuitry, including the substrate clamp transistor, and the charge pump circuitry can all be included on the same P-type substrate as the remaining, other circuits 122, such as memory cells which may be formed on this substrate.

Figure 5:
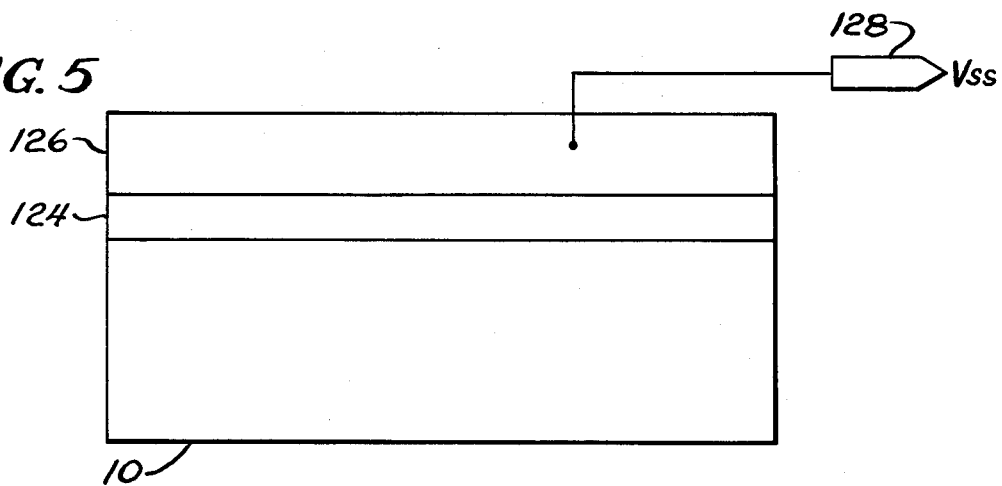
FIG. 5 shows the added substrate capacity.

FIG. 5 schematically illustrates the additional capacity which may be added in accordance with certain features of this invention. FIG. 5 does not illustrate the circuit components of the chip, but only is intended to illustrate that substrate 10 is covered with a thin oxide 124. Oxide 124 can illustratively be silicon dioxide having a thickness of between about 200 and 1000 angstroms. Situated over this thin oxide is a plate, illustratively formed of polysilicon which can have a thickness of 4000 to 5000 angstroms. Plate 126 is coupled to ground, that is, to the Vss pin 128. It will be appreciated, therefore, that this arrangement of having a plate 126 separated by an insulator 124 from another large plate 10 forms a large capacitor. This large capacity is used to keep the substrate from bouncing in voltage. Parasitic devices are generally capacitively coupled to the substrate, and the added capacity provided by this arrangement of elements 124 and 126 reduces the effects of such parasitic capacitance.

Figure 6:
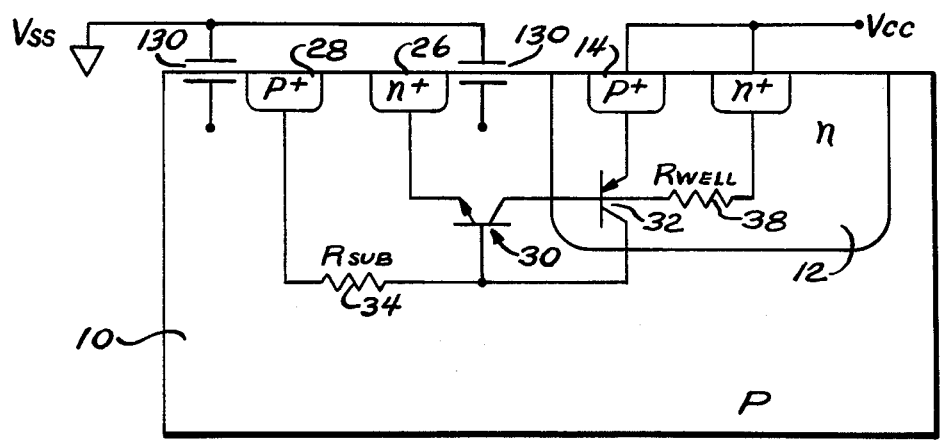
FIG. 6 schematically shows part of the circuit of FIG. 1 modified to have high substrate capacitance.

FIG. 6 is added simply to show schematically the added capacity. FIG. 6 illustrates the P substrate 10 having an N well 12 therein. It illustrates the P+ region 14 and N+ region 20 within well 12 as well as the P+ region 28 and N+ region 26 outside of the well. The transistors 30 and 32 which are susceptible to latch-up are illustrated. The substrate resistance 34 is shown connecting well 28 to the base of transistor 32. A well resistance 38 is shown between moat 20 and the collector of transistor 36. Capacitances 130 are shown between the ground connection Vss and substrate 10. These capacitances are relatively high compared to the capacitance of parasitic devices which can lead to latch-up. The reason for this capacitance addition is that the charge pump only weakly holds the substrate to, for example, −3 volts. Local capacitance and resistive disturbances can couple the substrate in localized regions above ground so that transistor 30 can turn on. Thus, the substrate capacity 130 is maximized with respect to local coupling capacitances.

It is to be appreciated that node 36 (FIG. 1) is biased with a negative potential through the operation of the disclosed circuitry. This prevents parasitic transistor 30 from turning on during power-up. Additionally, the capacitance between the substrate and ground is made high compared to capacitance couplings to the substrate from other sources.

In the preferred embodiment of the present invention, the width/length of the various transistors is as follows:
Transistor 58: 800 (width)
Transistor 62: 25,000 (width)
Transistor 64: 4/100
Transistor 66: 100 (width)
Transistor 80: 6 (width)
Capacitor 84: 79/20
Capacitor 86: 53/10
Transistor 90: 100 (width)
Capacitor 92: 525/50
Transistor 96: 50 (width)
Transistor 98: 20 (width)
Transistor 100: 100/5
Transistor 102: 50 (width)
Transistor 104: 200 (width)
Transistor 106: 20 (width)
Transistor 108: 20 (width)
Transistor 112: 6/6
Transistor 114: 6/6
Transistor 118: 6 (width)

It will be understood that the present description refers to an illustrative embodiment, and that various alterations and modifications can be made without departing from the present invention, defined by the appended claims.

I claim:

1. A method of using an on chip substrate bias voltage generator to control latch-up in a CMOS circuit on a substrate comprising operating the CMOS circuit, and biasing the substrate during normal circuit operation with said substrate bias voltage generator.

2. The method of claim 1 including:
providing a substrate to ground capacitance substantially greater than the normal parasitic capacitance;
sensing a power supply transition;
clamping the substrate to a known potential in response to sensing said power supply transition; and
releasing said clamping after said power supply transition.

3. The method of claim 2 wherein said biasing step comprises coupling a substrate bias voltage generator to the CMOS substrate, the method further including:
detecting when the substrate potential reaches a predetermined point; and
inhibiting said clamping in response to said detecting.

4. The method of claim 2 wherein said method includes:
sensing a power supply transition;
clamping the substrate to ground in response to said sensing;
determining when said power supply transition has ended;
releasing said clamping in response to said determining; and
pumping charge with respect to said substrate whereby except during power supply transitions, the substrate becomes biased to control latch-up.

5. The method of claim 4 further including:
detecting when pumping charge with respect to said substrate causes the substrate to reach a predetermined potential; and
inhibiting said clamping in response to said detecting, whereby said clamping does not occur except during power supply transitions.

6. A method for controlling latch-up in a CMOS circuit on a substrate comprising the steps of:
sensing a power supply transition;
clamping the substrate to a known potential in response to said sensing; and
releasing said clamping after said transition.

7. The method of claim 6 further including biasing the substrate after said transition to provide a second control over the substrate potential.

8. The method of claim 7 further including biasing the substrate after said releasing step.

9. Apparatus for controlling latch-up in a CMOS circuit on a substrate comprising the combination of:
a bias circuit coupled to control the potential of the substrate on which the CMOS circuit is located; and
a control circuit for selectively enabling and disabling said bias circuit.

10. The apparatus according to claim 10 including:
a circuit for sensing a power supply transition;
a clamp circuit for clamping the substrate to a known potential in response to said sensing circuit and arranged to release said clamp after said power supply transition.

11. The circuit according to claim 10 wherein said bias circuit includes a substrate bias voltage generator coupled to the CMOS substrate, and wherein the combination further includes a circuit for detecting when the substrate potential reaches a predetermined point, said clamp circuit being responsively coupled to said detecting circuit for inhibiting said clamping in response to said detection, said circuit including means for providing substrate to ground capacitance substantially greater than the normal parasitic capacitance.

12. The circuit according to claim 9 wherein said circuit combination comprises:
a circuit for sensing a power supply transition;

a clamping circuit for coupling the substrate to ground in response to said sensing circuit sensing a power supply transition; and being arranged to release said clamping in response to the substantial termination of a power supply transition; and a charge pump coupled to said substrate and to said clamping circuit for biasing the substrate.

13. The apparatus according to claim 12 further including:

a circuit for detecting when the substrate reaches a predetermined potential;

said clamping circuit being responsively coupled to said detecting circuit for inhibiting said clamping.

14. A circuit for controlling latch-up in a CMOS circuit on a substrate comprising the combination of:

a sensing circuit for sensing a power supply transition;

a circuit responsively coupled to said sensing circuit for clamping the substrate to a known potential; and said control circuit being coupled to release said control after said power supply transition.

15. The circuit combination according to claim 14 further including a substrate bias generator coupled to bias the substrate, said bias generator being coupled to said control circuit.

16. The circuit combination according to claim 15 wherein said bias generator is coupled to be permitted to bias the substrate in response to said control circuit releasing the substrate from the known potential in response to sensing a power supply transition.

17. A circuit for controlling latch-up in a CMOS circuit on a substrate comprising the combination of:

means for providing a substrate to ground capacitance;

a substrate bias generator coupled to the substrate for generating a bias thereon;

means coupled to receive a power supply signal and for sensing a power supply transition;

a clamping circuit responsively coupled to said sensing circuit for clamping the bias generator to ground potential in response to the sensing of a power supply transition;

said sensing circuit being coupled to release said clamping circuit in response to sensing that the power supply transition has substantially ended, whereby the substrate bias generator biases the substrate after the power supply transition thereby to inhibit latch-up.

18. The circuit combination according to claim 17 further including an inhibiting circuit responsively coupled to the substrate for detecting a predetermined potential, said circuit being controllingly coupled for inhibiting said clamping circuit in response to detecting said predetermined potential.

19. The circuit combination according to claim 17 wherein said combination includes:

a clamping transistor having its source-drain path coupling the substrate bias generator to ground;

a control transistor having its source-drain path coupled to connect a power supply voltage to the gate of said clamping transistor;

means coupled to the gate of said control transistor for turning on said control transistor in response to a power supply transition.

20. The circuit combination according to claim 19 further including an inhibiting circuit comprising a circuit for detecting a predetermined potential on the substrate, said inhibiting circuit being controllingly coupled to the gate of said controlled transistor for preventing said control transistor from coupling the power supply source to the gate of said clamping transistor.

* * * * *

UNITED STATES PATENT AND TRADEMARK OFFICE
CERTIFICATE OF CORRECTION

PATENT NO.  :  4,571,505

DATED       :  February 18, 1986

INVENTOR(S) :  Sargent S. Eaton, Jr.

It is certified that error appears in the above-identified patent and that said Letters Patent is hereby corrected as shown below:

Claims 1, 2, 9, 10 and 14 should read as follows:

1. A method of using an on chip substrate bias voltage generator to control latch-up in a CMOS circuit on a substrate comprising:
    operating the CMOS circuit;
    biasing the substrate during normal circuit operation with said substrate bias voltage generator;
    sensing a power supply transition;
    clamping the substrate to a known potential in response to sensing said power supply transition; and
    releasing said clamping after said power supply transition.

2. The method of claim 1 including providing a substrate to ground capacitance substantially greater than the normal parasitic capacitance.

9. Apparatus for controlling latch-up in a CMOS circuit on a substrate comprising the combination of:
    a bias circuit responsive to a control signal and being coupled to said substrate to control the potential of the substrate on which the CMOS circuit is located;
    a circuit for sensing a power supply transition; and
    a clamp circuit for clamping the substrate to a known potential in response to said sensing and arranged to release said clamping after said power supply transition.

10. The apparatus according to claim 9 wherein said control signal is provided by a control circuit coupled to said bias circuit for selectively enabling and disabling said bias circuit.

UNITED STATES PATENT AND TRADEMARK OFFICE
CERTIFICATE OF CORRECTION

PATENT NO. : 4,571,505

DATED : February 18, 1986

INVENTOR(S) : Sargent S. Eaton, Jr.

It is certified that error appears in the above-identified patent and that said Letters Patent is hereby corrected as shown below:

```
    14.   A circuit for controlling latch-up in a CMOS circuit
on a substrate comprising the combination of:
      a sensing circuit for sensing a power supply transition; and
      a circuit responsively coupled to said sensing circuit for
          clamping the substrate to a known potential and being
          coupled to release said clamping after said power
          supply transition.
```

Signed and Sealed this

Twenty-third Day of September 1986

[SEAL]

*Attest:*

DONALD J. QUIGG

*Attesting Officer*   *Commissioner of Patents and Trademarks*